(12) United States Patent
Okada et al.

(10) Patent No.: US 6,957,135 B2
(45) Date of Patent: Oct. 18, 2005

(54) ELECTRONIC CONTROL SYSTEM

(75) Inventors: Kazunori Okada, Chiryu (JP); Minoru Hozuka, Okazaki (JP)

(73) Assignee: Denso Corporation, Kariya (JP)

(*) Notice: Subject to any disclaimer, the term of this patent is extended or adjusted under 35 U.S.C. 154(b) by 204 days.

(21) Appl. No.: 10/678,229

(22) Filed: Oct. 6, 2003

(65) Prior Publication Data

US 2004/0080997 A1    Apr. 29, 2004

(30) Foreign Application Priority Data

Oct. 25, 2002  (JP)  ............................. 2002-311390
Aug. 29, 2003  (JP)  ............................. 2003-307331

(51) Int. Cl.$^7$ ............................................. G06F 19/00
(52) U.S. Cl. ........................... 701/33; 701/29; 701/34; 365/185.33
(58) Field of Search ............................. 701/33, 29, 34, 701/47, 36; 365/185.33, 192

(56) References Cited

U.S. PATENT DOCUMENTS 5,745,864 A * 4/1998 Hosoe et al. .................. 701/35
5,964,813 A * 10/1999 Ishii et al. ..................... 701/35
2002/0123833 A1 * 9/2002 Sakurai et al. ................ 701/33

FOREIGN PATENT DOCUMENTS

| JP | 4-336351(PAGE 2) | 11/1992 |
| JP | 5-216776(PAGE 2) | 8/1993 |
| JP | 5-79397 | 9/1993 |
| JP | 2000-35923 | 2/2000 |

* cited by examiner

Primary Examiner—Anh Phung
Assistant Examiner—Toan Le
(74) Attorney, Agent, or Firm—Nixon & Vanderhye P.C.

(57) ABSTRACT

An engine control system stores data indicating a monitor frequency ratio for each failure diagnosis target item in EEPROM and standby RAM being backed up by a battery. The failure diagnosis target items are designated based on Rate Base Monitor Method. A data item of the data indicating a monitor frequency is incremented by one, at one time at the maximum, for one operation period of the system. When the system starts its operation, whether a value S [i] in standby RAM is greater by one than a value E [i] in EEPROM is determined for each data item. When the determination is affirmed for a given data item, it is determined that storing of the given data item is not completed in EEPROM for the preceding operation period. The value S [i] is thereby written in EEPROM.

6 Claims, 4 Drawing Sheets

"CST DATA"

| | |
|---|---|
| i=0 | EVAPO NUM |
| i=1 | EVAPO DEN |
| i=2 | CATAL NUM |
| i=3 | CATAL DEN |
| i=4 | SENSOR NUM |
| i=5 | SENSOR DEN |
| ⋮ | |

"END FLAG"

| | |
|---|---|
| i=0 | F[0] |
| i=1 | F[1] |
| i=2 | F[2] |
| i=3 | F[3] |
| i=4 | F[4] |
| i=5 | F[5] |
| ⋮ | |

ELECTRONIC CONTROL SYSTEM

CROSS REFERENCE TO RELATED APPLICATIONS

This application is based on and incorporates herein by reference Japanese Patent Applications No. 2002-311390 filed on Oct. 25, 2002 and No. 2003-307331 filed on Aug. 29, 2003.

FIELD OF THE INVENTION

The present invention relates to an electronic control system that continuously stores specific data that is updated for an operation period by using an electrically erasable non-volatile memory. In particular, it relates to technology for detecting that storing data in the non-volatile memory is missed.

BACKGROUND OF THE INVENTION

Information such as failure diagnosis information or learned control values needs to be stored in an electronic control system for an automobile even while no operating electric power is supplied to the electronic control system. The information is therefore conventionally stored in a non-volatile memory such as EEPROM where data is electrically erasable. The information can be thereby continuously stored even when a backup battery runs out or is being disconnected. For instance, data in a given area of backup RAM being backed up by a battery is seriatim stored in EEPROM. When the data in the backup RAM is determined to be abnormal at starting timing of an operation period just after tuning on of operating electric power, the corresponding data in the EEPROM is written in the given area in the backup RAM. (Refer to Patent 1: JP-A-H4-336351.)

In this kind of the electronic control system, normality of the data stored in EEPROM is checked by using checksum. (Refer to Patent 2: JP-A-H5-216776.) Furthermore, there are other checking methods as follows: (1) Mirror data method and (2) Majority vote method. In Mirror data method, target data is stored in EEPROM along with mirror data. Here, the sum of an original value of the target data and the mirror data is designed as being a given value. When the sum of the target data and the mirror data does not become the given value, abnormality is determined. In Majority vote method, the target data is redundantly stored in three areas in EEPROM. The correct original value is determined by a majority vote among the three.

Meanwhile, an electronic control system for an automobile needs to continuously store a monitor frequency ratio according to Rate Base Monitor Method of OBD II (On Board Diagnostic II) by CARB (California Air Resources Board). The monitor frequency ratio is defined with the following formula:

Monitor frequency ratio= monitoring execution frequency/operation frequency

Here, the monitor frequency ratio is a frequency ratio of a failure diagnosis being executed on a given item and exists for each item such as a catalyst converter, a fuel evaporation system, an $O_2$ sensor, and the like. The operation frequency (hereinafter, referred to as denominator) is data that is incremented when a given traveling condition specified by legislation is effected for the given item. The monitoring execution frequency (hereinafter, referred to as numerator) is data that is incremented when it is determined that normality or anomaly is present after a condition of failure diagnosis execution specified by an automotive manufacturer is effected for the given item. Each of the numerator and the denominator is incremented by one or remains without being incremented, for an operation period. The operation period is from turning on to turning off of an ignition switch of the vehicle, or from turning on to turning off of operating electric power to an electronic control system executing a failure diagnosis. Therefore, once a numerator or denominator for the given item is incremented for a given operation period, the numerator or denominator is no more updated for the given operation period.

In the above checking methods, whether data in EEPROM is broken or not can be checked. However, whether rewriting data in the non-volatile memory such as EEPROM is completed or not for the preceding operation period of the electronic control system cannot be checked. In other words, failure to properly store data, or missing of storing data (hereinafter, also referred to as mis-storing of data) in EEPROM for the preceding operation period cannot be checked.

Namely, even when the mis-storing of data takes place, checksum or mirror data remains normal in relationship with the data that was unable to be rewritten. In Majority vote method, the same data is stored in three areas of the memory. The data is checked for each bit order in the three areas, so that the same bit appearing in more than one area is recognized as a correct bit in each bit order. Here, the mis-storing of data cannot be checked, either.

In particular, reading/writing data in EEPROM is executed through a serial communications line with a micro-computer, so that processing time for the reading/writing data needs to be more than that in RAM being built in the micro-computer. Therefore, there is a probability that the operating electric power to the electronic control system is turned off before the rewriting data in EEPROM is completed.

SUMMARY OF THE INVENTION

It is an object of the present invention to provide an electronic control system being capable of detecting mis-storing of data in a non-volatile memory such as EEPROM. Here, the data is continuous storing target data that needs to be continuously stored even while operating electric power is turned off. The data has a value that advances to a change direction with having regularity such as a numerator and denominator in Rate Base Monitor Method.

To achieve the above object, an electronic control system storing continuous storing target data in its electrically erasable non-volatile memory and a standby RAM being constantly supplied with data-storing electric power is providing with the following. When a given operation period is started, a determination of whether a value of the continuous storing target data in the standby RAM advances to a change direction further than a value of the continuous storing target data in the non-volatile memory. When the determination is affirmed, it is detected that storing of the continuous storing target data in the non-volatile memory is not completed for a former operation period preceding to the given operation period.

Here, explanation will be added in a case that a value Da of the continuous storing target data in the standby RAM advances to the change direction further than a value Db of the continuous storing target data in the non-volatile memory. In this case, when the given regularity is to simply increase, "Da>Db." By contrast, when the given regularity is to simply decrease, "Da<Db."

The above structure of the electronic control system enables mis-storing of data in a non-volatile memory to be detected. This cannot be realized by a checking method using checksum, mirror data, or majority vote. Namely, it is supposed that, although storing updated continuous storing target data in a standby RAM is completed, storing the updated continuous storing target data in a non-volatile memory is not completed due to turning off of operating electric power to the electronic control system. Here, a value of the continuous storing target data in the standby RAM advances to the change direction further than a value of the continuous storing target data in the non-volatile memory. This is thereby detected at starting timing of the subsequent operation period, so that the mis-storing of the data in the non-volatile memory can be detected.

In another aspect of the present invention, an electronic control system having an electrically erasable non-volatile memory and a standby RAM that is constantly supplied with data-storing electric power can be differently provided with the following. It is detected that a vehicle enters a given operating state. A failure diagnosis is executed on an in-vehicle device when a given condition is effected. A standby RAM stores an operation frequency and a failure diagnosis frequency. For an operation period, the operation frequency stored in the standby RAM is rewritten as being incremented by one when it is detected that the vehicle enters the given operating state. The failure diagnosis frequency stored in the standby RAM is rewritten as being incremented by one when the failure diagnosis is executed. After either the operation frequency or the failure diagnosis frequency is rewritten, the rewritten frequency is stored in the non-volatile memory. When a given operation period is started, a determination of whether the operation frequency or the failure diagnosis frequency in the standby RAM has a value greater by one than a value in the non-volatile memory. When the determination is affirmed, it is detected that storing of the operation frequency or the failure diagnosis frequency in the non-volatile memory is not completed for a former operation period preceding to the given operation period.

This structure enables the mis-storing of the operation frequency or failure diagnosis frequency in the non-volatile memory to be detected.

BRIEF DESCRIPTION OF THE DRAWINGS

The above and other objects, features, and advantages of the present invention will become more apparent from the following detailed description made with reference to the accompanying drawings. In the drawings.

DETAILED DESCRIPTION OF THE PREFERRED EMBODIMENTS

Figure 1:
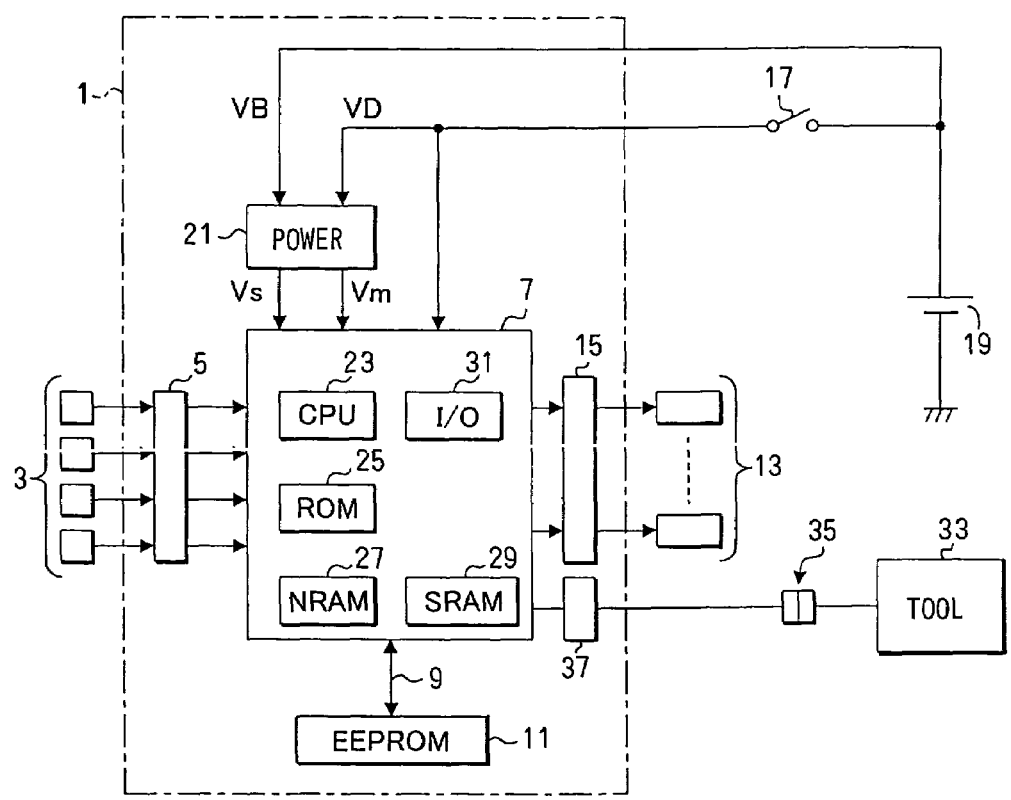
FIG. 1 is a block diagram showing structure of an electronic control system according to an embodiment of the present invention.

An electronic control system as an embodiment of the present invention will be explained regarding its structure with reference to FIG. 1. FIG. 1 shows a block diagram of structure of the electronic control system (hereinafter referred to as ECU) mounted in a vehicle for controlling an engine of an internal combustion type.

As shown in FIG. 1, an ECU 1 is equipped with an input processing circuit 5, a micro-computer 7, an EEPROM 11 as a rewritable non-volatile memory, an output circuit 15, and a power circuit 21. The input processing circuit 5 receives signals from various sensors 3 for detecting an engine state or states of peripheral devices of the engine to execute waveform processing. The micro-computer 7 executes various processing relating to an engine control, a failure diagnosis, and the like based on the signals from the sensors 3 through the input processing circuit 5. The EEPROM 11 is connected with the micro-computer 7 via a communications line 9 to store continuous storing target data. The continuous storing target data is included in data computed by the micro-computer 7 and needs to be continuously stored even after operating electric power for the ECU 1 is turned off. The output circuit 15 activates actuators 13 of a fuel injecting system (injector), an ignition system (igniter), or the like, being provided in the engine, based on a control signal from the micro-computer 7. The power circuit 21 receives, as an operating electric power, voltage VD supplied from a battery 19 based on turning on of an ignition switch 17. It then supplies the respective components, including the micro-computer 7 within the ECU 1, with power voltage Vm (e.g., 5 V) for operating. It furthermore generates to output auxiliary power voltage Vs (corresponding to data-storing electric power) for a standby RAM 29 within the micro-computer 7 to continuously store data.

The power circuit 21 also has a function of a so-called power-on reset. Namely the power circuit 21 continues to output a reset signal to the micro-computer 7 till the above power voltage Vm becomes stable after the ignition switch 17 is turned on to start supplying the power voltage Vm.

The micro-computer 7 is equipped with a known CPU 23, a non-volatile ROM 25, a volatile RAM 27, a standby RAM 29, and an input/output (I/O) 31. The non-volatile ROM 25 stores an executable program executed by the CPU 23. In detail, the executable program includes command codes constituting the executable program and fixed codes referred to when the executable program is executed. The volatile RAM 27 temporarily stores computation results or the like from the CPU 23. The standby RAM (hereinafter referred to as SRAM) 29 is backed up by a battery to be able to continuously store data by being supplied with the auxiliary power voltage Vs from the power circuit 21. The I/O 31 exchanges signals or data with the input processing circuit 5, the EEPROM 11, the output circuit 15, or the like. Here, the RAM 27 being not backed up by the battery is differentiated from the SRAM 29 by being referred to as NRAM (Normal RAM) 27.

The ECU 1 having the above components operates by receiving the power voltage VD from the battery 19 while the ignition switch 17 is turned on. As the ignition switch 17 is turned on and then a reset signal to the micro-computer 7 is released, the micro-computer 7 in the ECU 1 starts operation from an initial state to execute initialization processing and then controlling processing for controlling the engine. Here, the operation of the micro-computer 7 is done by that the CPU 23 executes the program included in the ROM 25.

The micro-computer 7 executes, e.g., periodically, a determination of whether an execution condition for a failure diagnosis is effected for each failure diagnosis target item such as the catalyst converter, the fuel evaporation system, the $O_2$ sensor, and the like specified in Rate Base Monitor Method of OBD II by CARB. When the execution condition is effected, the micro-computer 7 executes a failure diagnosis on the corresponding failure diagnosis target item to determine normality or anomaly. Furthermore, the micro-computer 7 continuously stores and updates the numerator (monitoring execution frequency as failure diagnosis frequency) and denominator (operation frequency) of the monitor frequency ratio by using the EEPROM 11 and SRAM 29.

Furthermore, the ECU 1 is connectable with a diagnosing tool 33 outside the vehicle via a diagnosis connector 35. The ECU 1 is designed as outputting corresponding data based on a request for outputting information relating to the failure diagnosis from the diagnosing tool 33. When outputting information relating to the above failure diagnosis monitor frequency ratio is requested, data of the numerator and denominator stored in the EEPROM 11 is outputted to the diagnosis tool 33. Here, the outputting processing is executed by the micro-computer 7. A communications circuit 37 shown in FIG. 1 is used for the micro-computer 7 to communicate with the diagnosing tool 33.

In the next place, processing executed by the micro-computer 7 in the ECU 1 will be explained regarding continuously storing and updating the numerator and denominator of the monitor frequency ratio for each failure diagnosis target item with reference to FIGS. 2A, 2B, 3 to 5.

Figures 2A, 2B, 3:
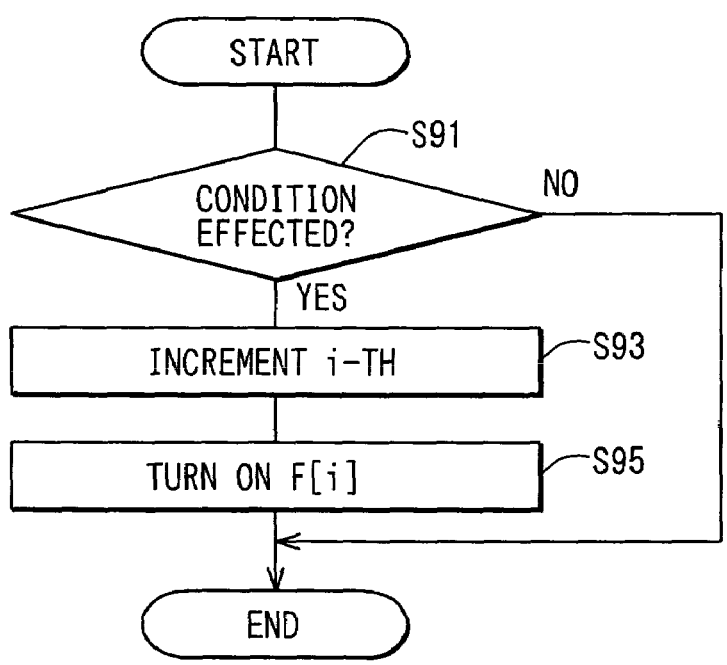
FIG. 2A is a diagram explaining continuous storing target data.
FIG. 2B is a diagram explaining an increment end flag.
FIG. 3 is a flowchart diagram showing processing of incrementing continuous storing target data in RAM by a micro-computer of an electronic control system.

As shown in FIG. 2A, the continuous storing target data (CST DATA) includes, in its blocks, a numerator (NUM) and a denominator (DEN) of a monitor frequency ratio for each of the failure diagnosis target items with assigning block numbers from zero. For instance, the zeroth and first blocks include data items for a numerator and a denominator of a failure diagnosis frequency ratio of a fuel evaporation system (EVAPO), respectively. The second and third blocks include data items for a numerator and a denominator of a failure diagnosis frequency ratio of a catalyst converter (CATAL), respectively. The fourth and fifth blocks include data items for a numerator and a denominator of a failure diagnosis frequency ratio of an 02 sensor (SENSOR), respectively.

Furthermore, as shown in FIG. 2B, in the NRAM 27, an increment end flag is included with having each increment end flag item F [i]. The increment end flag item F [i] indicates whether the corresponding data item in the block [i] in the continuous storing target data is incremented. Here, i is any one from zero to (n−1) when the total number of the blocks of the continuous storing target data is n.

The micro-computer 7, as shown in FIG. 3, when a condition for incrementing each data item is effected (Step 91: YES), the data item is incremented (Step 93) and the corresponding increment end flag item F [i] is tuned ON (Step 95).

Here, as previously explained, it is determined that a condition of incrementing each denominator is effected by the following steps: A traveling condition specified by the legislation for the corresponding failure diagnosis target item is effected, or it is effected when the vehicle enters a given operating state specified by the legislation for the corresponding failure diagnosis target item; And, that the traveling condition is effected is detected by detecting processing.

By contrast, it is determined that a condition of incrementing each numerator is effected by the following steps: A condition for failure diagnosis execution specified by the automotive manufacturer is determined to be effected for the corresponding failure diagnosis target item; And, the failure diagnosis is executed; The determination of normality or anomaly is completed. Here, each increment end flag item F [i] is previously cleared to OFF by initialization in the NRAM 27 (Step 205 in FIG. 5, to be explained). The initialization in the NRAM 27 is executed when the micro-computer 7 initializes at start of its operation.

Figure 4:
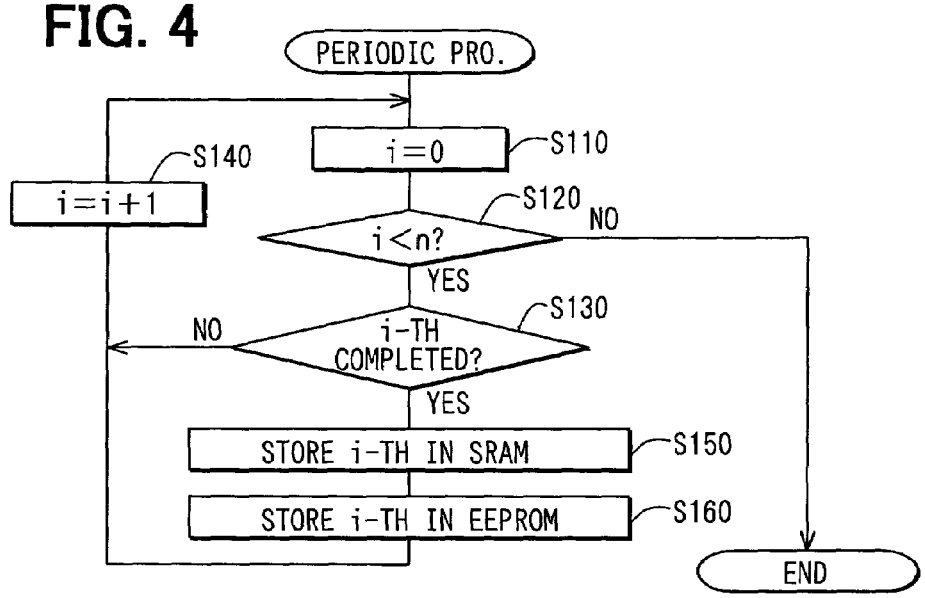
FIG. 4 is a flowchart diagram showing periodic processing by a micro-computer of an electronic control system.

Referring to FIG. 4, periodic processing is executed by the micro-computer 7 for given time intervals (e.g., every 64 ms). At Step 110, at first, Variation i is set to zero. Here, Variation i indicates the number of a block of the continuous storing target data and is stored in the NRAM 27. At Step 120, it is determined whether Variation i is less than the total number n of data items (or blocks) of the continuous storing target data.

When Variation i is determined to be less than n (Step 120: YES), the processing proceeds to Step 130. Here, it is determined whether incrementing a data item of the continuous storing target data in the block [i] is completed by detecting whether the corresponding increment end flag item F [i] is set to ON. When the incrementing is determined to be not completed, the processing proceeds to Step 140, where Variation i is incremented by one. The processing then returns to Step 120.

By contrast, when the incrementing is determined to be completed, the processing proceeds to Step 150. Here, the corresponding data item of the continuous storing target data in the block [i] in the NRAM 27 is stored in the SRAM 29. A value of the data item of the corresponding continuous storing target data in the SRAM 29 is thereby rewritten as being incremented by one time. Namely, when a condition for incrementing any data item of the continuous storing target data is effected, a stored value in the SRAM 29 is rewritten as being incremented by one time at Step 150.

Then, at Step 160, the corresponding data item of the continuous storing target data in the block [i] in the NRAM 27 is also stored in the EEPROM 11. The value in the SRAM 29 updated at Step 150 is also stored in the EEPROM 11. Thereafter, the processing proceeds to Step 140, where Variation i is incremented by one. The processing returns to Step 120.

Meanwhile, when Variation i is determined to be not less than n (Step 120: NO), the processing is terminated. Consequently, in the periodic processing in FIG. 4, in the processing at Steps 110 to 140, the increment end flag items F [i] corresponding to all the data items of the continuous storing target data are checked, so that any data item of the continuous storing target data that is incremented for the present operation period of the ECU 1 can be searched for. When there is a data item that is incremented for the present operation (Step 130: YES), the value of the data item in the NRAM 27 is written in both the SRAM 29 and the EEPROM 11 (Step 150, 160).

To save a frequency of data writing in the EEPROM 11, it can be designed that the data item that is previously written in the EEPROM 11 at Step 160 does not any more undergo the processing at Step 160.

In detail, a writing completion flag for each data item of the continuous storing target data can be provided in the NRAM 27. The writing completion flag is initialized to an OFF state by the initialization processing to the NRAM 27, along with the increment eng flag. At Step 160, a corresponding writing completion flag for the data item of the continuous storing target data that is written in the EEPROM 11 is switched to an ON state. At Step 130, even when it is determined that incrementing the data item of the continuous storing target data in the block [i] is completed, the processing directly returns to Step 140 with passing through the subsequent processing at Steps 150, 160 when the writing completion flag is already in the ON state.

The initialization processing will be explained with reference to FIG. 5. The initialization processing is executed by the micro-computer 7 at the start of the operation due to turning on of the ignition switch 17. As the micro-computer 7 starts the initialization processing, at first data in the NRAM 27 is initialized at Step 205. Then at Step 210, it is determined whether data in the SRAM 29 is normal. Here, the data in the SRAM 29 is determined to be normal by determining that there is no history that the battery 19 is disconnected in addition to determining that data is normal through checking of its checksum or parity.

When the data in the SRAM 29 is determined to be normal (Step 210: YES), the processing proceeds to Step 220. Here, Variation i indicating the number of a block of the continuous storing target data is set to zero. At Step 230, it is determined whether Variation i is less than the total number n of the data items of the continuous storing target data.

When Variation i is determined to be less than the total number n (Step 230: YES), the processing proceeds to Step 240. Here, it is determined whether a value S [i] in the SRAM 29 is equal to a value E [i], in the EEPROM 11, plus one. Here, the value S [i] or value E [i] is a value of the i-th data item of the continuous storing target data in the SRAM 29 or the EEPROM 11, respectively. When it is determined to be not equal, the processing proceeds to Step 250, where Variation i is incremented by one. The processing then returns to Step 230.

When it is determined to be equal, i.e., S [i]=E [i]+1 (Step 240: YES), it is determined that rewriting the i-th data item of the continuous storing target data in the EEPROM 11 is not completed. In other words, storing of the i-th data item in the EEPROM 11 is missed. The processing proceeds to Step 260, where the value S [i] is written in the EEPROM 11 as substituting for the value E [i]. Thereafter, the processing proceeds to Step 250, where Variation i is incremented by one. The processing then returns to Step 230.

On the other hands, when it is determined that Variation i is not less than the total number n, i.e., i≧n (Step 230: YES), the processing proceeds Step 280, where all the data items of the continuous storing target data in the SRAM 29 are copied in the NRAM 27. Hereafter, the processing proceeds to engine controlling processing, the periodic processing shown in FIG. 4, or the like.

Further, when it is determined that the data in the SRAM 29 is determined to be not normal (Step 210: NO), the processing proceeds to Step 270, where all data items of the continuous storing target data in the EEPROM 11 are copied in the SRAM 29. The processing then proceeds to Step 280, where the above-explained processing takes place.

Consequently, in the initialization processing, when the data in the SRAM 29 is normal (Step 210: YES) and storing data in the preceding operation period is missed in the EEPROM 11 (Step 240: YES), the data in the SRAM 29 is copied in the EEPROM 11 (Step 260).

Furthermore, when the data in the SRAM 29 is normal (Step 210: YES), the final values of the continuous storing target data in the preceding operation period are correctly stored in the SRAM 29 (Step 150 in FIG. 4). The values of the data in the SRAM 29 that correctly take over the values in the preceding operation period are thereby copied in the NRAM 27 (Step 280) to be updated in the present operation period.

When the data in the SRAM 29 is not normal (Step 210: NO), the values of the data in the EEPROM 11 are copied in the SRAM 29 (Step 270). It is because the final values of the continuous storing target data in the preceding operation period are assumed to be more correctly stored in the EEPROM 11 (Step 160 in FIG. 4) in comparison with the SRAM 29 whose data is determined to be not normal.

As explained above, according to the ECU 1 of the embodiment, mis-storing of the data in the EEPROM 11 is correctly detected regarding the data that is incremented by one at one time for one operation period. The data in the EEPROM 11 that is missed being stored is furthermore recovered by writing in the EEPROM 11 the data stored in the SRAM 29. For instance, the above-described data includes continuous storing target data that indicates a monitor frequency ratio of each diagnosis target item specified by Rate Base Monitor Method.

Furthermore, in the ECU 1 of the embodiment, when the ECU 1 starts the initialization processing along with turning on of the operating electric power VD, it is determined whether the data in the SRAM 29 is normal (Step 210). When the data in the SRAM 29 is determined to be not normal, the processing at Steps 220 to 260 is prohibited from taking place (Step 210: NO).

Otherwise, although the data in the SRAM 29 becomes abnormal, e.g., due to being disconnected of the battery 19, the abnormal data in the SRAM 29 may be mistakenly written in the EEPROM 11 and the correct data in the EEPROM 11 may be misrecognized as abnormal data.

(Modification)

Although one embodiment of the present invention is explained above, the present invention can be also directed to other embodiments.

In the above embodiment, continuous storing target data undergoes increasing change as being incremented by one at one time for one operation period of the ECU 1. At Step 240 in FIG. 5, it is thereby determined whether "S [i]=E [i]+1" is affirmative. However, when the data undergoes decreasing change, it can be determined whether "S [i]=E [i]−1" is affirmative.

Furthermore, when the data may undergo increasing change as being incremented by a given value at a plurality of times for one operation period, it can be determined whether "S [i]>E [i]" is affirmative. By contrast, when the data may undergo decreasing change as being incremented by a given value at a plurality of times for one operation period, it can be determined whether "S [i]<E [i]" is affirmative. Here, the given value can be variable instead of being constant.

In the above embodiment, writing the continuous storing target data in the SRAM 29 and the EEPROM 11 is executed in one periodic processing shown in FIG. 4. However, the writing can be executed every routine where each data item of the continuous storing target data is updated in the NRAM 27 with using a functional call, a subroutine form, or the like.

In the above embodiment, the NRAM 27 can be not provided. In this case, the SRAM 29 can be also used for data processing including processing of incrementing the continuous storing target data, so that processing at Step 150 in FIG. 4 and Steps 205, 280 in FIG. 5 is eliminated. The increment end flag item F [i] is thereby stored in the SRAM 29, so that initializing the flag can be included in the initialization processing.

Figure 5:
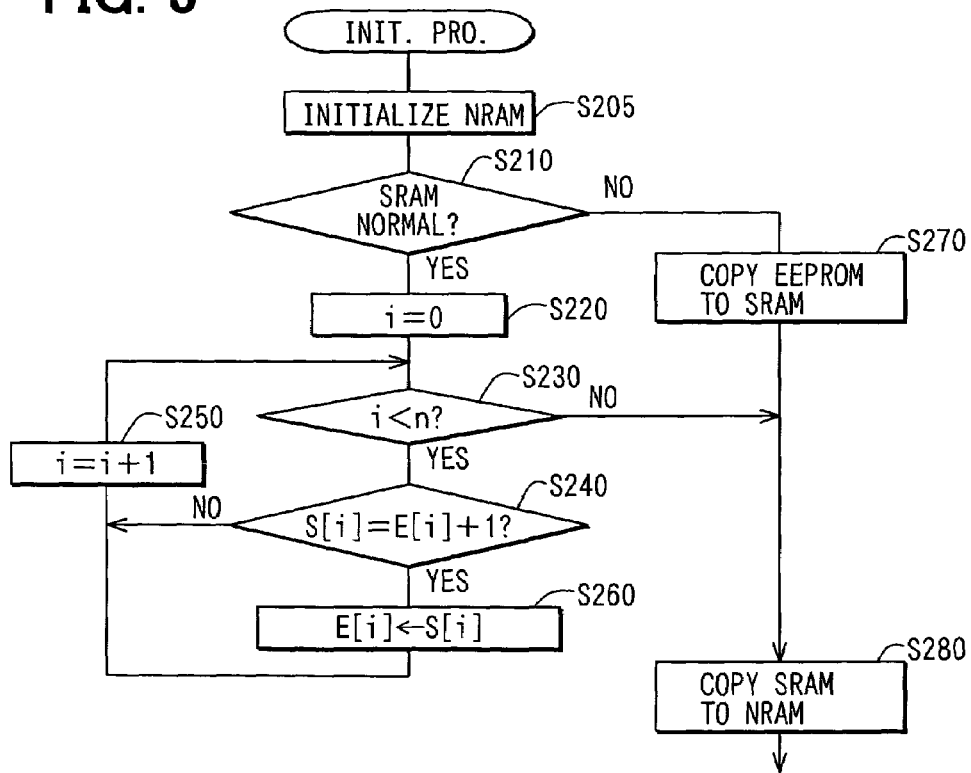
FIG. 5 is a flowchart diagram showing initialization processing by a micro-computer of an electronic control system.

In FIG. 5, processing at Step 270 can be executed just before the processing at Step 280 when either of the determinations at Step 210, 230 is negated. However, it is effective to execute the processing at Step 270 only when the data is determined to be not normal at Step 210.

The EEPROM 11 as a non-volatile memory being electrically erasable can be replaced with a flush ROM.

Figure 6:
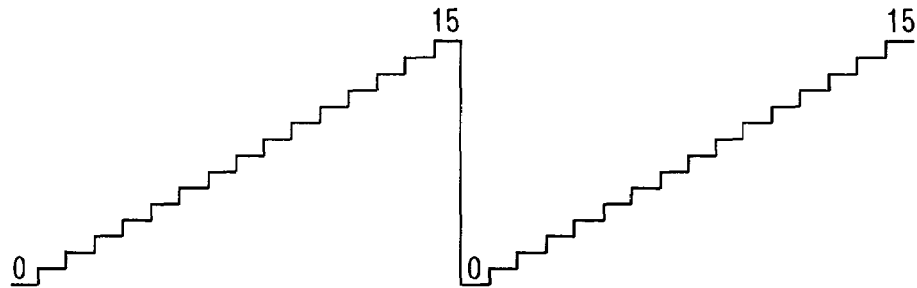
FIG. 6 is a diagram explaining another regularity of continuous storing target data.
Figure 7:
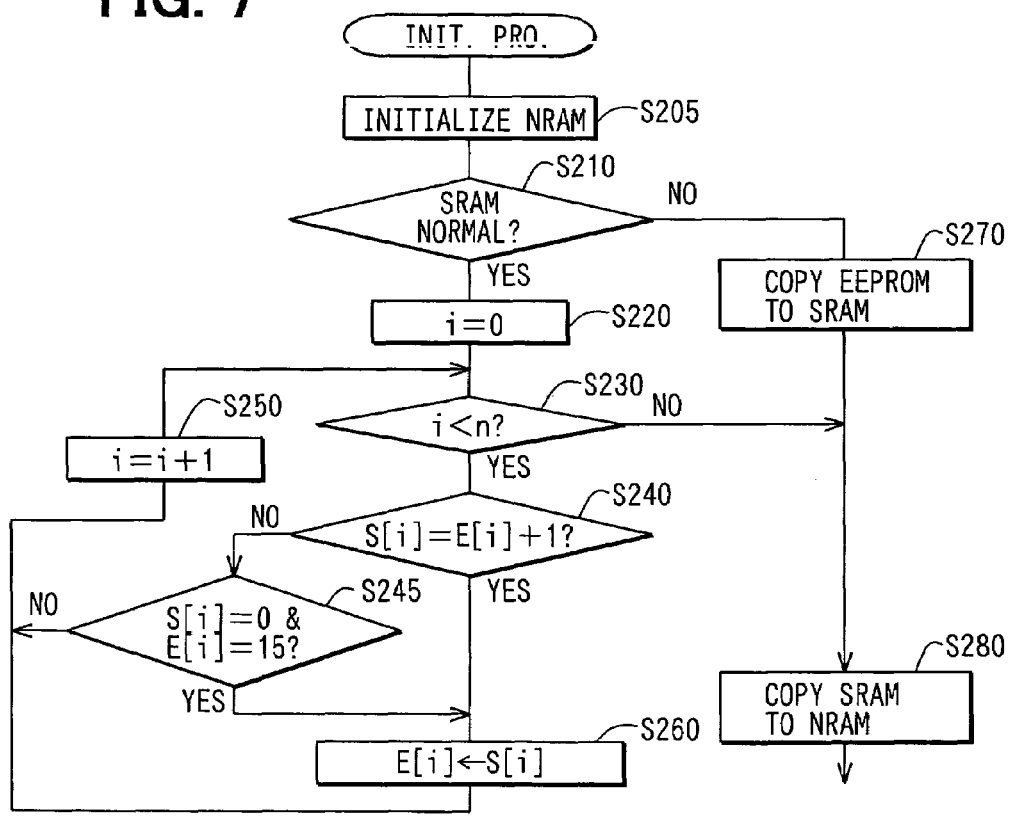
FIG. 7 is a flowchart diagram showing initialization processing based on the regularity shown in FIG. 6.

The continuous storing target data can be also not data that undergoes one-directional change of one of increasing and decreasing. It can be data that repeats increase and decrease from an initial value A to a final value B. In this case, mis-storing of the data can be detected based on regularity where the final value B eventually reaches the initial value A, and recovering the data can be then executed. In detail, as shown in FIG. 6, certain continuous storing target data has a characteristic where a value of the data is updated as being incremented one by one from an initial value of zero to a final value of fifteen and then as returning to the initial value of zero after reaching the final value. In this case, the initialization processing shown in FIG. 5 can be modified to that in FIG. 7. Processing at Steps in FIG. 7 having the same step number in FIG. 5 is the same as in FIG. 5, so that explanation of the processing at the same step numbers will be eliminated.

Namely, in the initialization processing, Step 245 is added to processing in FIG. 5. When it is determined that "S [i] =E [i]+1" is negated at Step 240, it is determined whether "S [i]=0 and E [i]=15" is affirmed at Step 245. When it is determined that "S [i]=0 and E [i]=15" is negated, the processing proceeds to Step 250. When it is determined that "S [i]=0 and E [i]=15" is affirmed, mis-storing in the i-th data item in the EEPROM 11 is determined to be taking place in the preceding operation period. The processing thereby proceeds to Step 260, where a value S [i] in the SRAM 29 can be copied in a value E [i] in the EEPROM 11.

In the above processing, even when the continuous storing target data is a kind of the above certain continuous storing target data having the regularity shown in FIG. 6, the mis-storing of the data in the EEPROM 11 can be detected. Furthermore, data can have different regularity where data is updated as being decremented one by one from an initial value of the maximum value to a final value of the minimum value and then as returning to the initial value of the maximum value after reaching the final value.

Furthermore, in the above embodiments, continuous storing target data is incremented by only one at one time, but it can be also incremented by any value instead of one, for instance, a certain integral number such as two, three, ten, or the like.

It will be obvious to those skilled in the art that various changes may be made in the above-described embodiments of the present invention. However, the scope of the present invention should be determined by the following claims.

What is claimed is:

1. An electronic control system that enters an operation period from turning on of operating electric power to turning off of the operating electric power and makes both a non-volatile memory and a standby RAM execute storing of continuous storing target data, wherein in the non-volatile memory data is electrically erasable, wherein the standby RAM is a memory and is continuously supplied with data-storing electric power for continuously storing data, and wherein the continuous storing target data needs to be continuously stored even while the operating electric power is turned off and has a value that is updated as advancing to a given change direction with at least one of increasing and decreasing based on given regularity, the electronic control system comprising:

determining means for executing, when a given operation period is started due to turning on of the operating electric power, a determination of whether a value of the continuous storing target data in the standby RAM advances to the given change direction further than a value of the continuous storing target data in the non-volatile memory; and detecting means for detecting, when the determination executed by the determining means is affirmed, that storing of the continuous storing target data in the non-volatile memory is not completed for a former operation period preceding to the given operation period.

2. The electronic control system according to claim 1, wherein the continuous storing target data has a value that is updated, at most one time, for an operation period from turning on of the operating electric power to turning off of the operating electric power, as advancing to the given change direction by a given integral number, wherein the determining means executes, when the given operation period is started due to turning on of the operating electric power, a given determination of whether a value of the continuous storing target data in the standby RAM advances to the given change direction by the given integral number than a value of the continuous storing target data in the non-volatile memory, and wherein the detecting means detects, when the given determination is affirmed, that storing of the continuous storing target data in the non-volatile memory is not completed for the former operation period preceding to the given operation period.

3. The electronic control system according to claim 1, further comprising:

recovering means for writing in the non-volatile memory the value of the continuous storing target data in the standby RAM when the detecting means detects that storing of the continuous storing target data in the non-volatile memory is not completed for the former operation period.

4. The electronic control system according to claim 1, further comprising:

prohibiting means for executing, when the given operation period is started, a certain determination of whether the continuous storing target data in the standby RAM is normal, and for prohibiting, when the certain determination is negated, the detecting means from detecting that storing of the continuous storing target data in the non-volatile memory is not completed for the former operation period even when the given determination is affirmed.

5. An electronic control system that enters an operation period from turning on of operating electric power to turning off of the operating electric power and controls an in-vehicle device in a vehicle, the electronic control system comprising:

state detecting means for detecting that the vehicle enters a given operating state;

failure diagnosing means for executing a failure diagnosis on the in-vehicle device when a given condition is effected;

a non-volatile memory where stored data is electrically erasable;

a standby RAM that is continuously supplied with data-storing electric power for continuously storing data and stores frequency information including an operation frequency and a failure diagnosis frequency;

rewriting means for rewriting the frequency information in the standby RAM for the operation period, wherein the operation frequency of the frequency information is rewritten as being incremented by one when the state detecting means detects that the vehicle enters the given operating state while the failure diagnosis frequency of the frequency information is rewritten as being incremented by one when the failure diagnosing means executes the failure diagnosis;

storing means for storing, after the rewriting means rewrites the frequency information, the rewritten frequency information in the non-volatile memory;

determining means for executing, when a given operation period is started due to turning on of the operating electric power, a determination of whether at least one frequency of the operation frequency and the failure diagnosis frequency in the standby RAM has a value greater by one than a value of the one frequency of the operation frequency and the failure diagnosis frequency in the non-volatile memory; and mis-storing detecting means for detecting, when the determination executed by the determining means is affirmed, that storing of the one frequency of the operation frequency and the failure diagnosis frequency in the non-volatile memory is not completed for a former operation period preceding to the given operation period.

6. The electronic control system according to claim 5, further comprising:

outputting means that is connectable with a diagnosing tool outside of the vehicle and is for outputting to the diagnosing tool the frequency information stored in the non-volatile memory when outputting of the frequency information is requested from the diagnosing tool.

* * * * *